(12) United States Patent
Cheng et al.

(10) Patent No.: US 10,910,482 B2
(45) Date of Patent: *Feb. 2, 2021

(54) NANOSHEET WITH CHANGING SIGE PERCENTAGE FOR SIGE LATERAL RECESS

(71) Applicant: International Business Machines Corporation, Armonk, NY (US)

(72) Inventors: Kangguo Cheng, Schenectady, NY (US); Xin Miao, Slingerlands, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/284,862

(22) Filed: Feb. 25, 2019

(65) Prior Publication Data

US 2019/0189781 A1    Jun. 20, 2019

Related U.S. Application Data

(63) Continuation of application No. 15/823,684, filed on Nov. 28, 2017, now Pat. No. 10,312,350.

(51) Int. Cl.
*H01L 29/66* (2006.01)
*H01L 29/423* (2006.01)
(Continued)

(52) U.S. Cl.
CPC .. *H01L 29/66742* (2013.01); *H01L 21/02603* (2013.01); *H01L 21/30604* (2013.01);
(Continued)

(58) Field of Classification Search
CPC .......... H01L 21/0245; H01L 21/02507; H01L 21/02532; H01L 21/02603;
(Continued)

(56) References Cited

U.S. PATENT DOCUMENTS 7,902,009 B2   3/2011   Simonelli et al.
7,989,901 B2   8/2011   Lin et al.
(Continued)

OTHER PUBLICATIONS

List of IBM Patents or Patent Applications Treated as Related.

*Primary Examiner* — Cheung Lee
(74) *Attorney, Agent, or Firm* — Robert Sullivan; Ryan, Mason & Lewis, LLP

(57) ABSTRACT

A method for manufacturing a semiconductor device includes forming a stacked configuration of a plurality of silicon germanium layers and a plurality of silicon layers on a semiconductor substrate, wherein the stacked configuration comprises a repeating arrangement of a silicon layer stacked on a silicon germanium layer, patterning the stacked configuration into a plurality of patterned stacks spaced apart from each other, and etching exposed sides of the plurality of silicon germanium layers to remove portions of the silicon germanium layers from lateral sides of each of the plurality of silicon germanium layers, wherein a concentration of germanium is varied between each of the plurality of silicon germanium layers to compensate for variations in etching rates between the plurality of silicon germanium layers to result in remaining portions of each of the plurality of silicon germanium layers having the same or substantially the same width as each other.

17 Claims, 6 Drawing Sheets

(51) Int. Cl.
*H01L 29/786* (2006.01)
*H01L 21/02* (2006.01)
*H01L 21/306* (2006.01)

(52) U.S. Cl.
CPC .. *H01L 29/42392* (2013.01); *H01L 29/66545* (2013.01); *H01L 29/66553* (2013.01); *H01L 29/66772* (2013.01); *H01L 29/66795* (2013.01); *H01L 29/66818* (2013.01); *H01L 29/78618* (2013.01); *H01L 29/78651* (2013.01); *H01L 29/78654* (2013.01); *H01L 29/78696* (2013.01); *H01L 21/0245* (2013.01); *H01L 21/02507* (2013.01); *H01L 21/02532* (2013.01)

(58) Field of Classification Search
CPC ......... H01L 21/30604; H01L 29/42392; H01L 29/66742; H01L 29/66772; H01L 29/66795; H01L 29/66818; H01L 29/78618; H01L 29/78651; H01L 29/78654; H01L 29/78696
See application file for complete search history.

(56) References Cited

U.S. PATENT DOCUMENTS

| | | | |
|---|---|---|---|
| 8,039,847 | B2 | 10/2011 | Nuzzo et al. |
| 9,006,066 | B2 | 4/2015 | Chi et al. |
| 9,129,829 | B2 | 9/2015 | Kuhn et al. |
| 9,184,269 | B2 | 11/2015 | Ching et al. |
| 9,287,357 | B2 | 3/2016 | Rodder et al. |
| 9,330,908 | B2 | 5/2016 | Adam et al. |
| 9,362,355 | B1 | 6/2016 | Cheng et al. |
| 9,653,547 | B1 * | 5/2017 | Chang ................. H01L 29/0673 |
| 10,312,350 | B1 * | 6/2019 | Cheng ............... H01L 29/78696 |
| 2013/0249015 | A1 | 9/2013 | Karve et al. |
| 2015/0295084 | A1 | 10/2015 | Obradovic et al. |
| 2015/0311315 | A1 | 10/2015 | Tsai et al. |
| 2016/0071729 | A1 | 3/2016 | Hatcher et al. |

\* cited by examiner

CROSS GATE VIEW

CROSS FIN VIEW

NANOSHEET WITH CHANGING SIGE PERCENTAGE FOR SIGE LATERAL RECESS

BACKGROUND

Nanowires and nanosheets are relatively thin wires or sheets, for example, with dimensions measured in nanometers (nm). Nanowires are circular or square shaped or approximately circular or square shaped in cross-section and have diameters or widths such as, for example, less than about 5 nm or 10 nm. A nanowire typically has a width that is equal or substantially equal to its height. Nanosheets are elliptical or rectangular shaped, or approximately elliptical or rectangular shaped in cross section and have thicknesses or heights such as, for example, less than about 5 nm or 10 nm. The width of a nanosheet may be considerably larger than this height, such as about 20 nm to about 60 nm in the case of a nanosheet which is about 4 nm to about 8 nm in height. The thickness of a nanosheet layer, or height of the rectangle in cross section, affects the electrostatics of the nanosheet.

Nanowire and nanosheet devices can be viable device options instead of fin field-effect transistors (FinFETs). For example, nanowires or nanosheets can be used as the fin structure in a dual-gate, tri-gate or gate-all-around (GAA) FET device. Complementary metal-oxide semiconductor (CMOS) scaling can be enabled by the use of stacked nanowires and nanosheets, which offer superior electrostatics and higher current density per footprint area than FinFETs. Manufacturing of nanowire or nanosheet devices may include lateral recessing of certain semiconductor layers in a nanowire or nanosheet stack, which may be performed by etching. However, when the gate pitch becomes small, the loading effect becomes strong, which leads to different etch rates between upper and lower semiconductor layers. This causes uneven gate lengths between upper and lower portions of a resulting device having stacked gate regions.

SUMMARY

According to an exemplary embodiment of the present invention, a method for manufacturing a semiconductor device includes forming a stacked configuration of a plurality of silicon germanium layers and a plurality of silicon layers on a semiconductor substrate, wherein the stacked configuration comprises a repeating arrangement of a silicon layer stacked on a silicon germanium layer, and a concentration of germanium is varied between each of the plurality of silicon germanium layers. The method further includes patterning the stacked configuration into a plurality of patterned stacks spaced apart from each other, etching exposed sides of the plurality of silicon germanium layers to remove portions of the silicon germanium layers from lateral sides of each of the plurality of silicon germanium layers, wherein remaining portions of each of the plurality of silicon germanium layers have the same or substantially the same width as each other, selectively removing the remaining portions of each of the plurality of silicon germanium layers from the plurality of patterned stacks, and replacing the removed remaining portions of each of the plurality of silicon germanium layers with respective gate structures.

According to an exemplary embodiment of the present invention, a semiconductor device includes a plurality of stacked semiconductor structures spaced apart from each other on a semiconductor substrate, wherein each of the plurality of stacked semiconductor structures comprises a stacked configuration of a plurality of gate structures and a plurality of silicon layers on the semiconductor substrate, wherein the stacked configuration comprises a repeating arrangement of a silicon layer stacked on a gate structure. The semiconductor device also includes a plurality of epitaxial source/drain regions between the plurality of stacked semiconductor structures, wherein the epitaxial source/drain regions extend from sides of the plurality of silicon layers. Each of the plurality of gate structures has the same or substantially the same width as each other.

According to an exemplary embodiment of the present invention, a method for manufacturing a semiconductor device includes forming a stacked configuration of a plurality of silicon germanium layers and a plurality of silicon layers on a semiconductor substrate, wherein the stacked configuration comprises a repeating arrangement of a silicon layer stacked on a silicon germanium layer, patterning the stacked configuration into a plurality of patterned stacks spaced apart from each other, etching exposed sides of the plurality of silicon germanium layers to remove portions of the silicon germanium layers from lateral sides of each of the plurality of silicon germanium layers, wherein a concentration of germanium is varied between each of the plurality of silicon germanium layers to compensate for variations in etching rates between the plurality of silicon germanium layers to result in remaining portions of each of the plurality of silicon germanium layers having the same or substantially the same width as each other, and replacing the remaining portions of each of the plurality of silicon germanium layers with respective gate structures having the same or substantially the same width as each other.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1A:
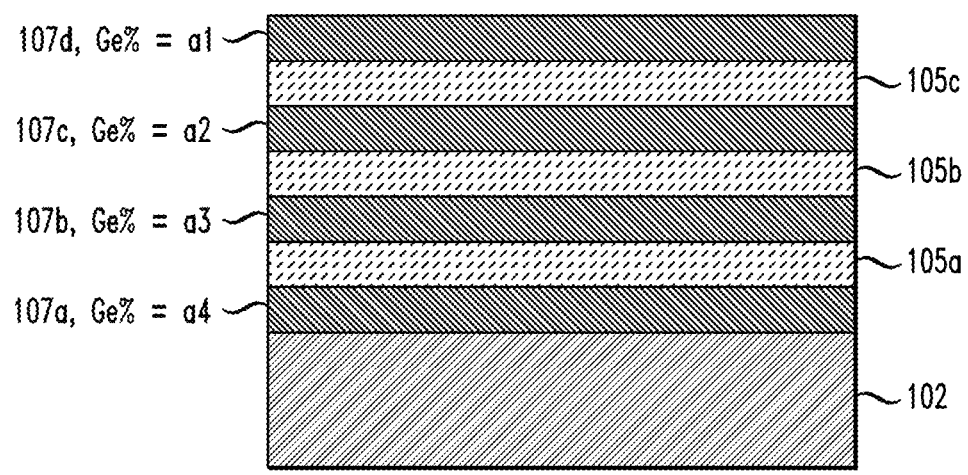
FIGS. 1A and 1B are schematic cross-sectional views illustrating manufacturing of a transistor device and showing formation of a stacked structure of silicon (Si) and silicon germanium (SiGe) nanosheet or nanowire layers on a semiconductor substrate, according to an embodiment of the invention.

Exemplary embodiments of the invention will now be discussed in further detail with regard to semiconductor devices and methods of manufacturing same and, in particular, to fabrication of both shared and non-shared gate structures.

It is to be understood that the various layers and/or regions shown in the accompanying drawings are not drawn to scale, and that one or more layers and/or regions of a type commonly used in, for example, complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, CMOSs, MOSFETs, nanowire FETs, nanosheet FETs and/or FinFETs. By way of non-limiting example, the semiconductor devices can include, but are not limited to FET, CMOS, MOSFET, nanowire FET, nanosheet FET and FinFET devices, and/or semiconductor devices that use FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention relate to methods and structures to compensate for different lateral etch rates between upper and lower stacked semiconductor layers caused by smaller gate pitches and resulting strong loading effect. For example, due to loading effect, upper silicon germanium (SiGe) nanosheet or nanowire layers in a stacked structure with other semiconductor layers (e.g., silicon (Si) nanosheet or nanowire layers) are laterally etched at a faster rate than lower SiGe layers in the stacked structure. The varied etch rate causes more SiGe to be laterally etched in the upper portions of the stacked structure so that the resulting upper SiGe layers are narrower than the lower SiGe layers. In accordance with an embodiment of the present invention, a concentration (e.g., percentage) of germanium (Ge) in SiGe nanosheet or nanowire layers is varied between upper and lower portions of nanosheet or nanowire stacks. The percentage of Ge affects the etch rate of the SiGe, whereby a higher percentage of Ge in SiGe layer results in a faster etch rate. In order to compensate for the different lateral etch rates between upper and lower stacked SiGe layers, the percentage of Ge is increased in the lower SiGe as compared to the upper SiGe layers so that the same or substantially the same amount of SiGe from each layer is removed during etching to result in the SiGe layers having the same or substantially the same width after etching is completed.

Embodiments of the present invention can use hot hydrochloric acid (HCl) as an etchant, where higher Ge percentage SiGe has a higher etch rate than lower Ge percentage SiGe. In order to compensate for the loading effect, the SiGe nanosheets or nanowires have a changing Ge percentage from top to bottom, instead of using constant Ge percentage SiGe layers.

Figure 1B:
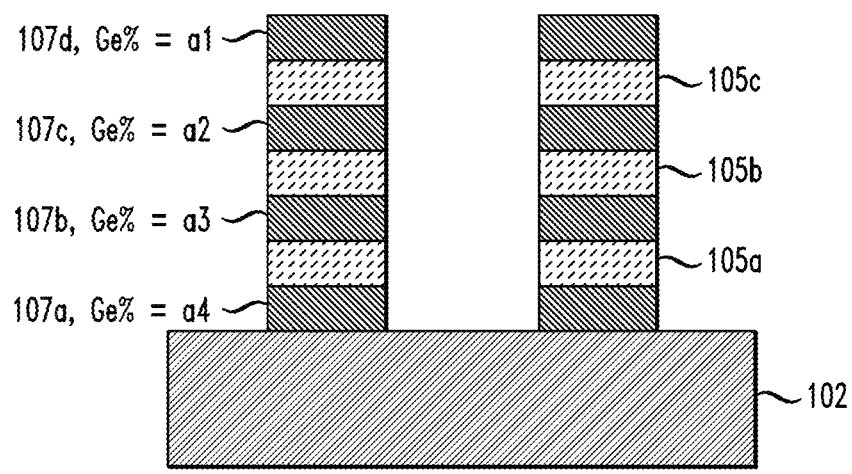

FIGS. 1A and 1B are schematic cross-sectional views illustrating manufacturing of a transistor device and showing formation of a stacked structure of silicon (Si) and silicon germanium (SiGe) nanosheet or nanowire layers on a semiconductor substrate, according to an embodiment of the invention. Referring to FIGS. 1A and 1B, which are respectively cross gate and cross fin views, a semiconductor substrate 102 comprises semiconductor material including, but not limited to, silicon (Si), silicon germanium (SiGe), silicon carbide (SiC), silicon germanium carbide (SiGeC), III-V, II-V compound semiconductor or other like semiconductor. In addition, multiple layers of the semiconductor materials can be used as the semiconductor material of the substrate.

In accordance with an embodiment of the present invention, the substrate 102 comprises a bulk silicon substrate. Layers of silicon germanium 107a, 107b, 107c and 107d and silicon 105a, 105b and 105c are epitaxially grown in an alternating and stacked configuration on the substrate 102, so that a first SiGe layer 107a is followed a first Si layer 105a on the first SiGe layer 107a, which is followed by a second SiGe layer 107b on the first Si layer 105a, and so on. While three Si layers 105a-c and four SiGe layers 107a-d are shown, the embodiments of the present invention are not necessarily limited to the shown number of layers 105, 107, and there may be more or less layers in the same alternating configuration depending on design constraints.

Referring to FIGS. 1A and 1B, in a non-limiting illustrative embodiment, a first SiGe layer 107a of a SiGe/Si nanosheet stack is formed on the substrate 102 by epitaxial growth. In accordance with an embodiment of the present invention, the layers 107a-d include, for example, germanium at concentrations of a4, a3, a2 and a1, respectively, where a4>a3>a2>a1. For example, according to an embodiment, a4 may be in a range of about 25% Ge to about 45% Ge, a3 may be in a range of about 20% Ge to about 40% Ge, a2 may be in a range of about 15% Ge to about 35% Ge, and a1 may be in a range of about 10% Ge to about 30% Ge, but are not necessarily limited thereto. Other concentrations of Ge can also be used to obtain the same or substantially the same width after etching is completed. Factors affecting the concentrations may include, for example, the height and/or number of the layers, etchant used, and selectivity requirements between SiGe and Si nanosheets. In a non-limiting illustrative embodiment, a height of the layers 107a, 107b and 107d can be in the range of about 5 nm to about 15 nm depending on the application of the device.

In a non-limiting illustrative embodiment, a first silicon layer 105a of the SiGe/Si nanosheet stack is formed on the first SiGe layer 107a by epitaxial growth. In accordance with an embodiment of the present invention, the layers 105a-105c include the same or a similar composition to the substrate 102. In a non-limiting example, a height of the layers 105a-105c can be in the range of about 5 nm to about 15 nm depending on the desired process and application.

Additional SiGe and silicon layers 107b-d, 105b-c in a stacked configuration to form the remaining SiGe and silicon layers are formed on the first (lower) silicon layer 105a by epitaxial growth. In accordance with an embodiment of the present invention, each of the layers 105a-c has the same or substantially the same composition and size as each other, and each of the layers 107a-d has the same or substantially the same size and different compositions (i.e., percentage of Ge).

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a PECVD apparatus. A number of different sources may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, ldisilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking. By "in-situ" it is meant that the dopant that dictates the conductivity type of the doped layer is introduced during the process step, e.g., epitaxial deposition, that forms the doped layer.

Figure 2:
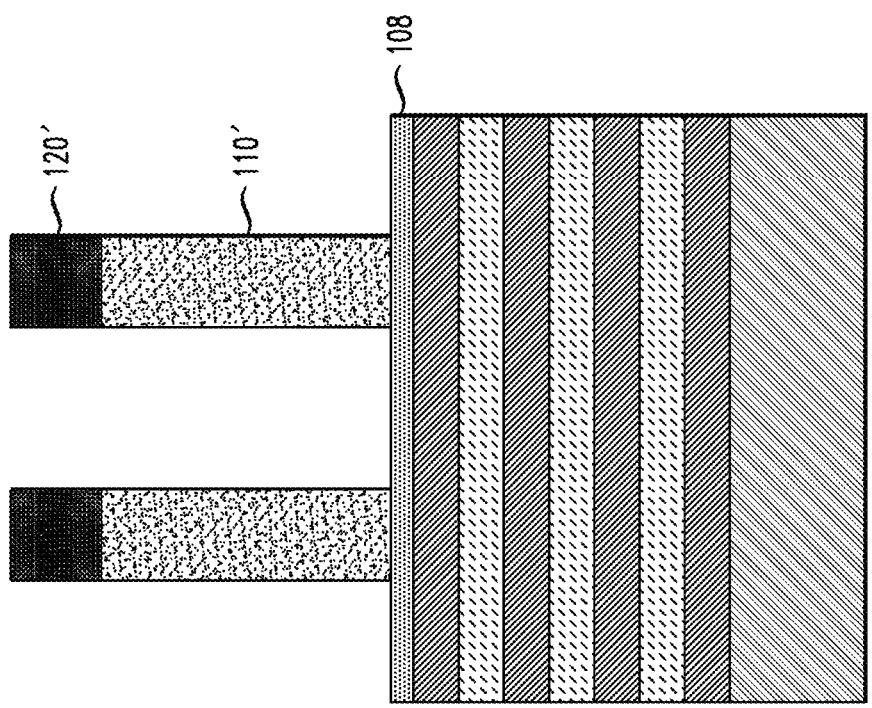
FIGS. 2 and 3 are schematic cross-sectional views illustrating manufacturing of a transistor device and showing formation of dummy gates, according to an embodiment of the invention.
Figure 3:
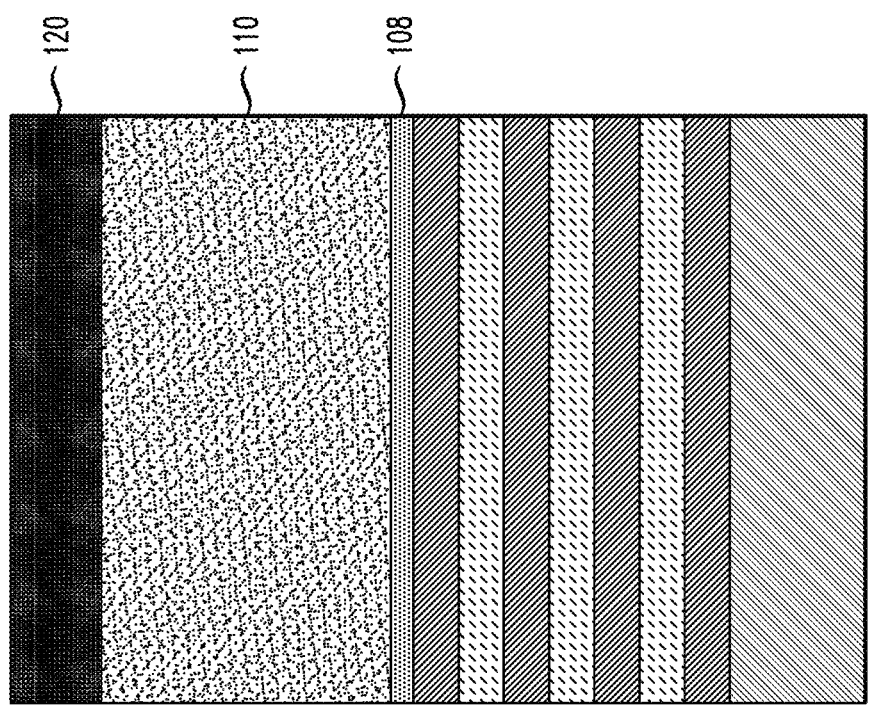

FIGS. 2 and 3 are schematic cross-sectional views illustrating manufacturing of a transistor device and showing formation of dummy gates, according to an embodiment of the invention. Referring to FIGS. 2 and 3, a dummy gate layer 110, including, but not necessarily limited to, polysilicon, amorphous silicon, or a dielectric material such as, for example, oxide or silicon nitride, is deposited on and around the stacked configuration of Si and SiGe using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating. A hard mask layer 120 is formed on top of the dummy gate layer 110 by one or more of the deposition techniques noted in connection with deposition of the dummy gate layer 110. The hard mask material can comprise for example, silicon oxide, silicon nitride, silicon oxynitride, boron nitride, silicon boron nitride, or multilayered stacks thereof. The hard mask and dummy gate layers 120 and 110 are planarized by a planarization process, such as, chemical mechanical polishing (CMP), and lithography and etching steps to remove excess dummy gate and hard mask material, and pattern the deposited layers into dummy gates 110' and hard masks 120' in what is to become device channel regions.

In accordance with an embodiment of the present invention, prior to forming the dummy gate layer 110, a relatively thin liner layer 108 is deposited on the stacked configuration of Si and SiGe using one or more of the deposition techniques noted in connection with deposition of the dummy gate layer 110. The liner layer can comprise, for example, silicon dioxide ($SiO_2$) or silicon oxynitride (SiON), and has a height of about 2 nm to about 8 nm. The liner layer 108 functions as an etch stop layer during dummy gate formation.

Figure 4:
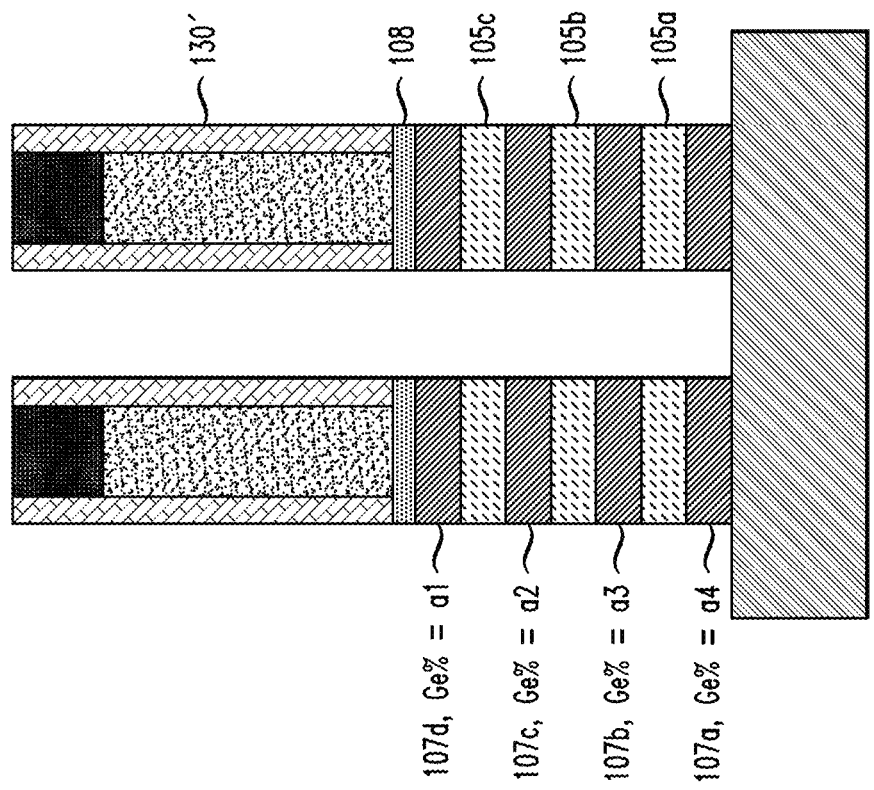
FIG. 4 is a schematic cross-sectional view illustrating manufacturing of a transistor device and showing spacer deposition on dummy gates, according to an embodiment of the invention.

FIG. 4 is a schematic cross-sectional view illustrating manufacturing of a transistor device and showing spacer deposition on dummy gates, according to an embodiment of the invention. Referring to FIG. 4, according to an embodiment, a dielectric spacer layer 130, such as, for example, silicon oxide, silicon nitride, silicon oxynitride, boron nitride, silicon boron nitride, or multilayered stacks thereof, is deposited conformally on the nanosheet or nanowire SiGe/Si stack, as well on sidewalls of the dummy gates 110' and hardmask layers 120', and on a top surface of the hardmask layers 120. Deposition of the spacer material 130 can be performed using one or more conformal deposition techniques including, but not necessarily limited to, CVD or ALD.

Figure 5:
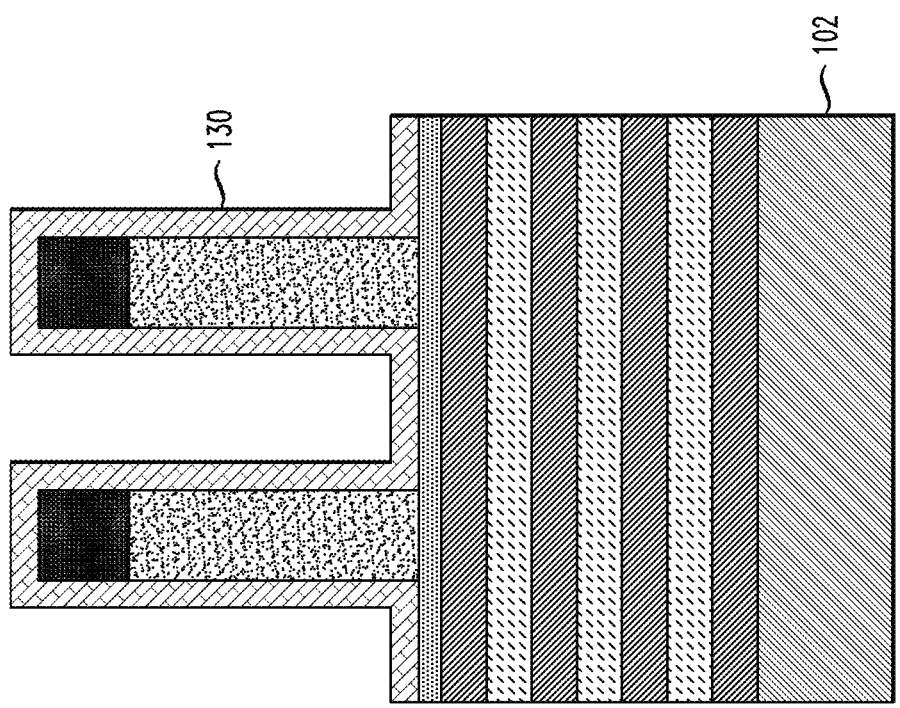
FIG. 5 is a schematic cross-sectional view illustrating manufacturing of a transistor device and showing removal of portions of the spacer layer and patterning of the stacked nanosheet or nanowire layers, according to an embodiment of the invention.

FIG. 5 is a schematic cross-sectional view illustrating manufacturing of a transistor device and showing removal of portions of the spacer layer and patterning of the stacked nanosheet or nanowire layers, according to an embodiment of the invention. Referring to FIG. 5, the horizontal portions of the dielectric material 130 are removed, using, for example, etching, to form spacers 130'. Then, exposed portions of the stacked nanosheet or nanowire layers, which are not under the spacer, hardmask and dummy gate layers 130', 120' and 110', are removed using, for example, an etching process, such as reactive ion etching (ME). As can be seen in FIG. 5, the spacer layers 130' on the sidewalls of the dummy gates 110' and the hardmask layers 120', and portions of the stacked nanosheets or nanowires under the spacer layers 130' and under the dummy gates 110' remain after the etching process, and portions of the stacked nanosheets or nanowires in areas that will correspond source/drain regions are removed.

Figure 6:
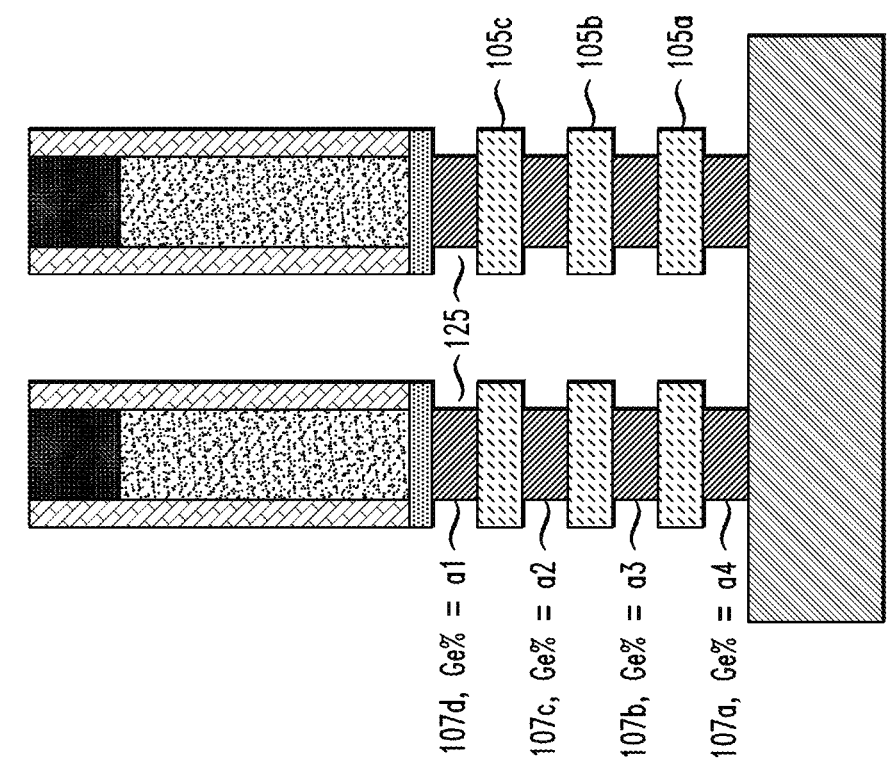
FIG. 6 is a schematic cross-sectional view illustrating manufacturing of a transistor device and showing recessing of silicon germanium portions of the patterned stacks, according to an embodiment of the invention.

FIG. 6 is a schematic cross-sectional view illustrating manufacturing of a transistor device and showing recessing of silicon germanium (SiGe) portions of the patterned stacks, according to an embodiment of the invention. Referring to FIG. 6, lateral (e.g., side) portions of the SiGe layers 107a-107d are removed to create vacant areas 125 which will be eventually replaced with spacers 135' as discussed further herein in connection with FIGS. 7 and 8, so that the SiGe layers 107a-107d are covered during the epitaxial growth of the source/drain layers 140 and lateral epitaxial growth does not occur from the SiGe layers 107a-107d of the patterned stacks.

According to an embodiment, the side portions of the layers 107a-d are laterally etched using hot HCl. A temperature range at which etching with hot HCl is performed is about 400° C. to about 700° C. Since the Ge concentration in the SiGe layers 107a-107d is increased from layer 107d to 107a, the etch rates of the SiGe layers 107a-107d is the same or substantially the same to result in etched SiGe layers 107a-d having the same or substantially the same width in the left-right direction. Accordingly, the amounts of SiGe removed to result in the vacant areas 125 is the same or substantially the same in each of the SiGe layers 107a-d due to the varying percentage of Ge in layers 107a-107d, which compensates for the varied etch rates from the top to the bottom of the stacks caused by loading effect, as discussed herein above. As used herein "substantially the same" can refer to a difference of ±2 nm.

Other etchants can be used, including, but not necessarily limited to hot SC1 ($NH_4OH:H_2O_2:H_2O$) solution. The etching of the layers 107a-107d is performed selective to layers 105a-105c, 108, 120' and 130'.

Figure 7:
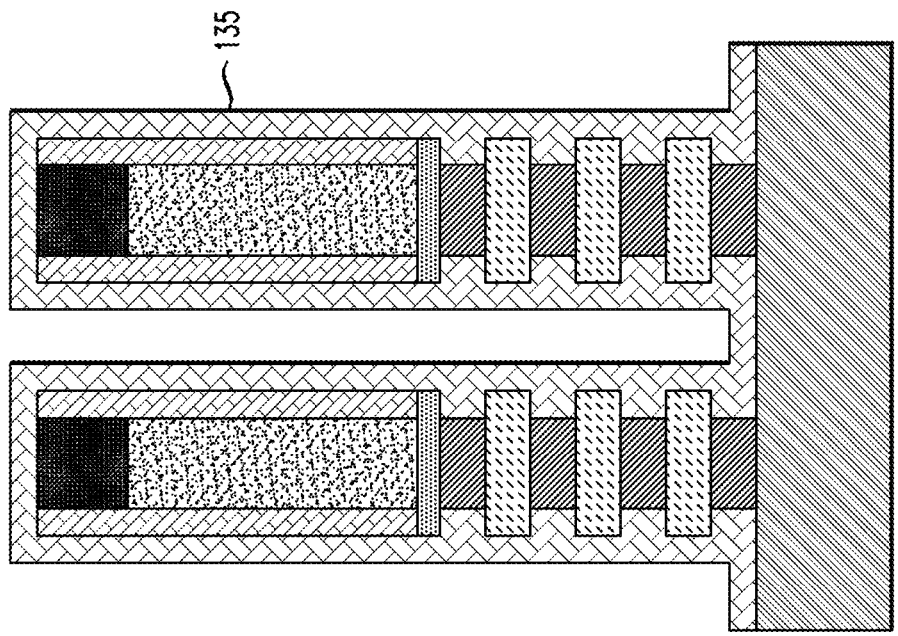
FIG. 7 is a schematic cross-sectional view illustrating manufacturing of a transistor device and showing deposition of a liner layer, according to an embodiment of the invention.

FIG. 7 is a schematic cross-sectional view illustrating manufacturing of a transistor device and showing deposition of a liner spacer layer, according to an embodiment of the invention. Referring to FIG. 7, a liner layer 135 is conformally deposited on the substrate 102, on sides of the SiGe/Si stacks, including in the vacant areas 125, on sides of the spacers 130' and on top of the spacers and hard masks 120'. Deposition of the liner spacer layer 135 can be performed using one or more conformal deposition techniques including, but not necessarily limited to, CVD or ALD. The spacer liner layer 135 includes a dielectric, such as, for example, silicon oxide, silicon nitride, silicon oxynitride, boron nitride, silicon boron nitride, or multilayered stacks thereof.

Figure 8:
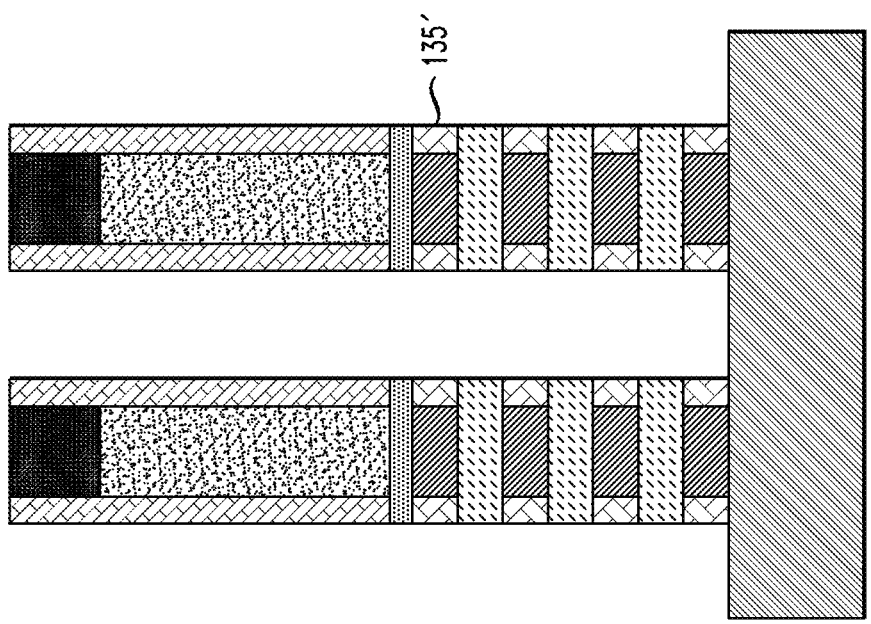
FIG. 8 is a schematic cross-sectional view illustrating manufacturing of a transistor device and showing formation of inner spacers to cover SiGe portions of the patterned stacks, according to an embodiment of the invention.

FIG. 8 is a schematic cross-sectional view illustrating manufacturing of a transistor device and showing formation of inner spacers to cover SiGe portions of the patterned stacks, according to an embodiment of the invention. Referring to FIG. 8, portions of the spacer liner layer 135 not covered by the spacers 130' and/or Si layers 105a-c, are removed using, for example, isotropic etching to form inner spacers 135' covering the SiGe 107a-107d portions of the patterned stacks. In accordance with an embodiment of the present invention, the vacant portions 125 left by removal of the side portions of the layers 107a-107d are filled in by the inner spacers 135'. The isotropic etching process can include, but is not necessarily limited to, a wet etch process using, for example, diluted high temperature phosphoric acid and hydrofluoric (HF) acid, or a dry etch process, such as isotropic $CF_4$ or $SF_6$ to remove excess portions of the spacer liner layer 135.

The inner spacers 135' cover the SiGe layers 107a-107d during the epitaxial growth of the source/drain layers 140 and lateral epitaxial growth does not occur from the SiGe layers 107a-107d of the patterned stacks.

Figure 9:
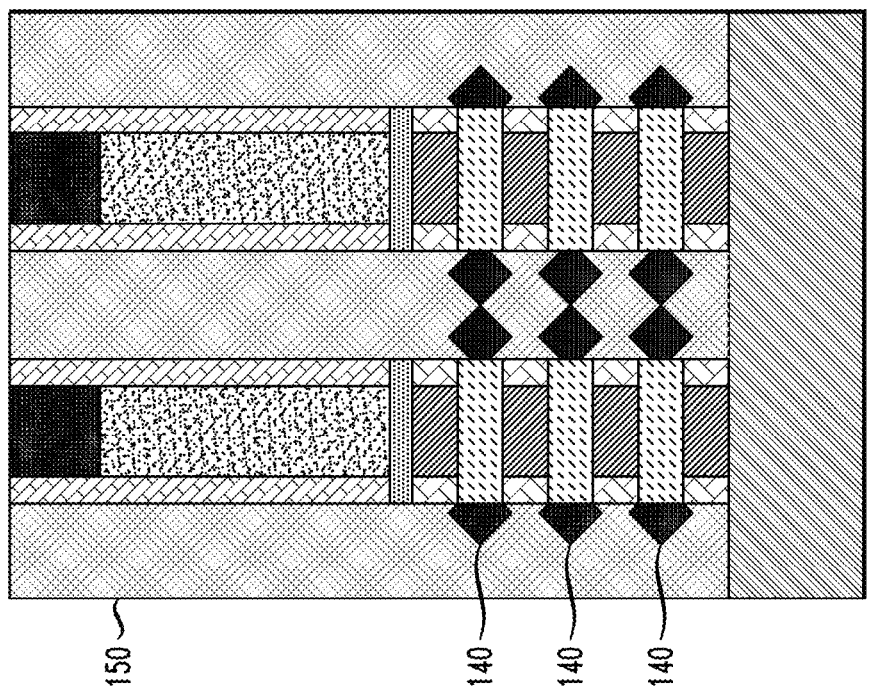
FIG. 9 is a schematic cross-sectional view illustrating manufacturing of a transistor device and showing formation of source/drain epitaxial layers and inter layer dielectric (ILD) layer deposition, according to an embodiment of the invention.

FIG. 9 is a schematic cross-sectional view illustrating manufacturing of a transistor device and showing formation of source/drain epitaxial layers and inter layer dielectric (ILD) layer deposition, according to an embodiment of the invention. Referring to FIG. 9, epitaxial source/drain layers 140 are laterally grown from the exposed silicon regions 105a-105c of the patterned Si/SiGe stacks. The epitaxial source/drain layers 140 become the source/drain regions for transistor devices, such as, for example, NFETs or PFETs, and can comprise in-situ phosphorous doped (ISPD) Si:C for n-type devices, or in-situ boron doped (ISBD) SiGe for p-type devices, at concentrations of about $1E19/cm^3$ to about $1E21/cm^3$.

An ILD layer 150, including, but not necessarily limited to, silicon dioxide ($SiO_2$), low-temperature oxide (LTO), high-temperature oxide (HTO), field oxide (FOX) or some other dielectric are deposited on the substrate 102 to fill in areas around the epitaxial source/drain layers 140 and in remaining spaces between the patterned SiGe/Si stacks and the dummy gate and hardmask layers 110', 120'. The ILD layer 150 can be deposited using, for example, CVD, PECVD, RFCVD, PVD, ALD, MLD, MBD, PLD, LSMCD, and/or sputtering, followed by planarization by, for example, CMP, down to the hardmasks 120'.

Figure 10:
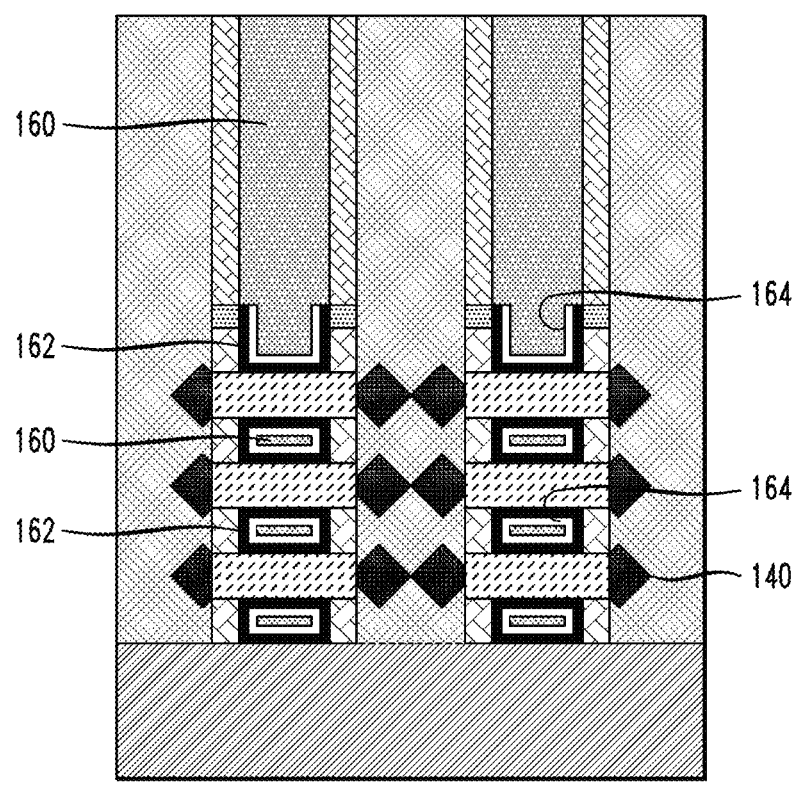
FIG. 10 is a schematic cross-sectional view illustrating manufacturing of a transistor device and showing formation of gate structures in place of removed dummy gates, according to an embodiment of the invention.

FIG. 10 is a schematic cross-sectional view illustrating manufacturing of a transistor device and showing formation of gate structures in place of removed dummy gates, according to an embodiment of the invention. Referring to FIG. 10, the hardmask layers 120', dummy gates 110' and SiGe layers 107a-107d are selectively removed. Then, the silicon nanosheets or nanowires 105a-105c are suspended, and gate structures 160 are formed in place of the removed hardmask layers 120', dummy gates 110' and SiGe layers 107a-107d.

In accordance with an embodiment of the present invention, the gate structures include a gate dielectric layer such as, for example, a high-K dielectric layer 162 including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the gate structures include a work-function metal (WFM) layer 164, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer 162. The gate structures further include a gate layer 160 including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer 162 and the gate dielectric layer 164.

The layers for the gate structures can be deposited using, for example, CVD, PECVD, RFCVD, PVD, ALD, MLD, MBD, PLD, LSMCD, and/or sputtering, followed by planarization by, for example, CMP.

According to an embodiment of the invention, source/drain contacts can be formed by etching contact area trenches through the ILD layer 150 to the source/drain region 140. The trenches are filled with a contact material, such as, for example, electrically conductive material including, but not necessarily limited to, tungsten, cobalt, zirconium, tantalum, titanium, aluminum, ruthenium, and/or copper. A silicide/germanide layer may be formed in the trenches before filling a remaining portion of the trenches with the electrically conductive material to form the contact regions/areas. The silicide/germanide layer may be formed in the trenches by, for example, silicidation (e.g., formation of an alloy including a portion of a contact material with an exposed underlying or side portions of a silicon or germanium layer), before filling the trenches with a remainder of electrically conductive material. Excess materials from the contact areas formed above the top surface of the ILD layer 150 can be removed utilizing a planarization process, such as CMP.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:
1. A method for manufacturing a semiconductor device, comprising:
    forming a stacked configuration of a plurality of first semiconductor layers and a plurality of second semiconductor layers on a semiconductor substrate, wherein:
        the stacked configuration comprises a repeating arrangement of a second semiconductor layer stacked on a first semiconductor layer; and
        a concentration of germanium is varied between each of the plurality of first semiconductor layers;
    patterning the stacked configuration into a plurality of patterned stacks spaced apart from each other;
    etching exposed sides of the plurality of first semiconductor layers to remove portions of the first semiconductor layers from lateral sides of each of the plurality of first semiconductor layers, wherein remaining portions of each of the plurality of first semiconductor layers have the same or substantially the same width as each other;
    selectively removing the remaining portions of each of the plurality of first semiconductor layers from the plurality of patterned stacks; and
    replacing the removed remaining portions of each of the plurality of first semiconductor layers with respective gate structures;
    wherein the concentration of germanium in a top layer of the plurality of first semiconductor layers in the stacked configuration is less than the concentration of germanium in a bottom layer of the plurality of first semiconductor layers in the stacked configuration.

2. The method according to claim 1, wherein each of the respective gate structures has the same or substantially the same width as each other.

3. The method according to claim 1, wherein the concentration of germanium in each of the plurality of first semiconductor layers increases from a top layer to a bottom layer of the plurality of first semiconductor layers in the stacked configuration.

4. The method according to claim 1, wherein the etching is performed using hydrochloric acid (HCl).

5. The method according to claim 4, wherein the etching is performed at a temperature of about 400° C. to about 700° C.

6. The method according to claim 1, further comprising filling vacant areas left by the removed portions of the first semiconductor layers from the lateral sides with a dielectric.

7. The method according to claim 6, wherein the filling comprises:
    conformally depositing a dielectric liner layer on the plurality of patterned stacks and on the substrate; and
    removing portions of the dielectric liner layer outside of the vacant areas.

8. The method according to claim 7, further comprising growing a plurality of epitaxial source/drain regions between the plurality of patterned stacks, wherein the epitaxial source/drain regions are grown from exposed sides of the plurality of second semiconductor layers in the plurality of patterned stacks.

9. The method according to claim 1, further comprising forming a plurality of dummy gates spaced apart from each other on the stacked configuration, wherein the plurality of dummy gates cover a portion of the stacked configuration in a channel region.

10. A method for manufacturing a semiconductor device, comprising:

forming a stacked configuration of a plurality of first semiconductor layers and a plurality of second semiconductor layers on a semiconductor substrate, wherein the stacked configuration comprises a repeating arrangement of a second semiconductor layer stacked on a first semiconductor layer;

patterning the stacked configuration into a plurality of patterned stacks spaced apart from each other;

etching exposed sides of the plurality of first semiconductor layers to remove portions of the first semiconductor layers from lateral sides of each of the plurality of first semiconductor layers;

wherein a concentration of at least one semiconductor material in the first semiconductor layers is varied between each of the plurality of first semiconductor layers to compensate for variations in etching rates between the plurality of first semiconductor layers; and replacing remaining portions of each of the plurality of first semiconductor layers with respective gate structures having the same or substantially the same width as each other;

wherein the concentration of the at least one semiconductor material in a top layer of the plurality of first semiconductor layers in the stacked configuration is less than the concentration of the at least one semiconductor material in a bottom layer of the plurality of first semiconductor layers in the stacked configuration.

11. The method according to claim 10, wherein the concentration of the at least one semiconductor material in each of the plurality of first semiconductor layers increases from a top layer to a bottom layer of the plurality of first semiconductor layers in the stacked configuration.

12. A method for manufacturing a semiconductor device, comprising:

forming a stacked configuration of a plurality of first semiconductor layers and a plurality of second semiconductor layers on a semiconductor substrate, wherein the stacked configuration comprises a repeating arrangement of a second semiconductor layer stacked on a first semiconductor layer;

patterning the stacked configuration into a plurality of patterned stacks spaced apart from each other;

etching exposed sides of the plurality of first semiconductor layers to remove portions of the first semiconductor layers from lateral sides of each of the plurality of first semiconductor layers;

wherein a concentration of germanium is varied between each of the plurality of first semiconductor layers to compensate for variations in etching rates between the plurality of first semiconductor layers to result in remaining portions of each of the plurality of first semiconductor layers having the same or substantially the same width as each other; and replacing remaining portions of each of the plurality of first semiconductor layers with respective gate structures having the same or substantially the same width as each other;

wherein the concentration of germanium in a top layer of the plurality of first semiconductor layers in the stacked configuration is less than the concentration of germanium in a bottom layer of the plurality of first semiconductor layers in the stacked configuration.

13. The method according to claim 12, wherein the concentration of germanium in each of the plurality of first semiconductor layers increases from a top layer to a bottom layer of the plurality of first semiconductor layers in the stacked configuration.

14. The method according to claim 12, wherein the etching is performed using hydrochloric acid (HCl).

15. The method according to claim 12, further comprising filling vacant areas left by the removed portions of the first semiconductor layers from the lateral sides with a dielectric.

16. The method according to claim 15, wherein the filling comprises:

conformally depositing a dielectric liner layer on the plurality of patterned stacks and on the substrate; and removing portions of the dielectric liner layer outside of the vacant areas.

17. The method according to claim 16, further comprising growing a plurality of epitaxial source/drain regions between the plurality of patterned stacks, wherein the epitaxial source/drain regions are grown from exposed sides of the plurality of second semiconductor layers in the plurality of patterned stacks.

* * * * *